(12) United States Patent
Lee et al.

(10) Patent No.: US 12,501,539 B2
(45) Date of Patent: Dec. 16, 2025

(54) SUBSTRATE INCLUDING A REFERENCE VOLTAGE LAYER HAVING AN IMPEDANCE CALIBRATOR

(71) Applicant: SK hynix Inc., Icheon-si (KR)

(72) Inventors: Jae Hoon Lee, Icheon-si (KR); Jong Wook Kim, Icheon-si (KR); Ju Il Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 185 days.

(21) Appl. No.: 18/306,874

(22) Filed: Apr. 25, 2023

(65) Prior Publication Data

US 2024/0196515 A1 Jun. 13, 2024

(30) Foreign Application Priority Data

Dec. 7, 2022 (KR) .................. 10-2022-0169763

(51) Int. Cl.
*H05K 1/02* (2006.01)
*H05K 1/09* (2006.01)
*H05K 1/11* (2006.01)

(52) U.S. Cl.
CPC ............ *H05K 1/0213* (2013.01); *H05K 1/09* (2013.01); *H05K 1/111* (2013.01); *H05K 1/115* (2013.01); *H05K 2201/0776* (2013.01)

(58) Field of Classification Search
CPC ........ H05K 1/0213; H05K 1/09; H05K 1/111; H05K 1/115; H05K 1/0219; H05K 1/0225; H05K 1/165; H05K 1/0251; H05K 1/0366; H05K 1/0224; H05K 1/0236; H05K 2201/0776; H05K 2201/0792; H05K 2201/09336; H05K 2201/09672; H05K 2201/09327; H05K 2201/093; H05K 1/0218–0227

See application file for complete search history.

(56) References Cited

U.S. PATENT DOCUMENTS

| | | | |
|---|---|---|---|
| 5,736,679 A * | 4/1998 | Kresge .................. | H05K 1/116 174/250 |
| 7,897,880 B1 * | 3/2011 | Goergen .............. | H05K 1/0237 174/265 |
| 11,328,859 B2 | 5/2022 | Lin et al. | |
| 2008/0000681 A1 * | 1/2008 | Nakamura ........... | H05K 1/0251 174/262 |
| 2009/0056999 A1 * | 3/2009 | Kashiwakura ....... | H05K 1/0251 174/262 |

(Continued)

FOREIGN PATENT DOCUMENTS

KR 100764914 B1 10/2007

*Primary Examiner* — Roshn K Varghese
(74) *Attorney, Agent, or Firm* — WILLIAM PARK AND ASSOCIATES LTD.

(57) ABSTRACT

A substrate in accordance with an embodiment of the disclosure includes a signal transmission layer including a signal transmission pad and a signal transmission interconnection; a first dielectric layer stacked on the signal transmission layer; and a first reference voltage layer stacked on the first dielectric layer. The first reference voltage layer includes a first space hole and an impedance calibrator. The impedance calibrator includes an impedance calibration part disposed in the first space hole; and a first bridge connecting a first portion of the impedance calibration part to a first portion of the first reference voltage layer.

18 Claims, 13 Drawing Sheets

(56) References Cited

U.S. PATENT DOCUMENTS

2013/0003333 A1\* 1/2013 Toyao ................. H05K 1/0298
361/777
2020/0274221 A1\* 8/2020 Suzuki ................ H05K 1/0253

\* cited by examiner

SUBSTRATE INCLUDING A REFERENCE VOLTAGE LAYER HAVING AN IMPEDANCE CALIBRATOR

CROSS-REFERENCE TO RELATED APPLICATIONS

The present application claims priority to Korean Patent Application No. 10-2022-0169763, filed on Dec. 7, 2022, in the Korean Intellectual Property Office, which is incorporated herein by reference in its entirety.

BACKGROUND

1. Technical Field

The present disclosure generally provides a substrate, and more particularly, a substrate including a reference voltage layer having an impedance calibrator.

2. Related Art

A package substrate or a system substrate such as a printed circuit board (PCB) includes multiple conductive layers.

SUMMARY

A substrate in accordance with an embodiment of the disclosure may include a signal transmission layer including a signal transmission pad and a signal transmission interconnection; a first dielectric layer stacked on the signal transmission layer; and a first reference voltage layer stacked on the first dielectric layer. The first reference voltage layer may include a first space hole and an impedance calibrator. The impedance calibrator may include an impedance calibration part disposed in the first space hole; and a first bridge coupling a first portion of the impedance calibration part to a first portion of the first reference voltage layer.

A substrate in accordance with an embodiment of the disclosure may include a first signal transmission layer; a first reference voltage layer stacked on the first signal transmission layer; and a second signal transmission layer stacked on the first reference voltage layer. The first signal transmission layer may include a plurality of first signal transmission pads and a plurality of first signal transmission interconnections. The first reference voltage layer may include a plurality of first space holes vertically overlapping the plurality of first signal transmission pads, respectively; an impedance calibration part disposed in at least one of the first space holes; and a first bridge electrically connecting a first portion of the impedance calibration part to a first portion of the first reference voltage layer. The impedance calibration part may have one of a spiral shape, a plate shape, and a web shape.

A substrate in accordance with an embodiment of the disclosure may include a signal transmission layer, a reference voltage layer, and a dielectric layer interposed between the signal transmission layer and the reference voltage layer. The signal transmission layer may include a plurality of signal transmission pads; and a plurality of signal transmission interconnections electrically connected to the plurality of signal transmission pads, respectively. The reference voltage layer may include a first space hole vertically overlapping with first one of the signal transmission pads; a second space hole vertically overlapping with second one of the signal transmission pads; an impedance calibration part disposed in the first space hole; a first bridge electrically connecting a first portion of the impedance calibration part to the reference voltage layer; and a second bridge electrically connecting a second portion of the impedance calibration part to the reference voltage layer. The impedance calibration part has one of a spiral shape, a plate shape, and a web shape.

DETAILED DESCRIPTION

As the integration degree of the semiconductor device increases, an impedance calibrator for adjusting the impedance of the semiconductor device is formed in the conductive layer of the substrate. For example, the impedance calibrator is formed in the signal transmission layer of the substrate. Recently, as conductive interconnections become more complicated, it becomes difficult to form the impedance calibrator in the signal transmission layer. In an embodiment of the present disclosure, it is proposed a substrate structured to include an impedance calibrator formed in reference voltage layers rather than a signal transmission layer among conductive layers of the substrate for semiconductor devices or electronic systems operates using an AC voltage.

An embodiment of the disclosure provides a substrate including a reference voltage layer having an impedance calibrator.

It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present.

Figure 1:
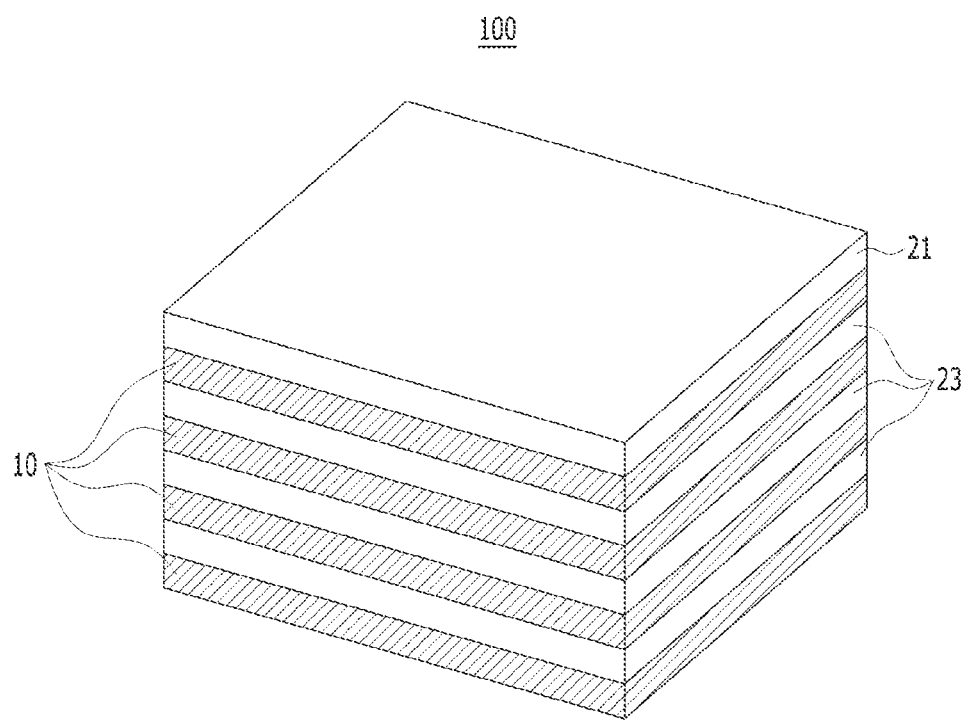
FIG. 1 is a longitudinal perspective view illustrating a stacked structure of a substrate according to an embodiment of the disclosure.

FIG. 1 is a longitudinal perspective view illustrating a stacked structure of a substrate 100 according to an embodiment of the disclosure. Referring to FIG. 1, a substrate 100 according to an embodiment of the disclosure may include an upper insulating layer 21, a lower insulating layer 22, and a plurality of conductive layers 10 and a plurality of dielectric layers 23 alternately stacked. Each of the plurality of dielectric layers 23 may be interposed between the plurality of conductive layers 10.

The substrate 100 may be a printed circuit board (PCB) used in a semiconductor package or a system circuit. The upper insulating layer 21 and the lower insulating layer 22 may include a solder resist material. For example, the upper insulating layer 21 may be an upper solder resist layer, and the lower insulating layer 22 may be a lower solder resist layer. The plurality of dielectric layers 23 may be a plurality of prepreg layers. The plurality of conductive layers 10 may be a plurality of copper foil layers. In another embodiment, the substrate 100 may be a redistribution layer. For example, the plurality of conductive layers 10 may be a plurality of metal layers, and each of the upper insulating layer 21, the lower insulating layer 22, and the plurality if dielectric layers 23 may be silicon nitride based insulating layers or silicon oxide based insulating layers. In the figure, although four conductive layers 10 are exemplarily illustrated, at least two conductive layers 10 may be stacked in the technical concepts of the disclosure.

Figure 2:
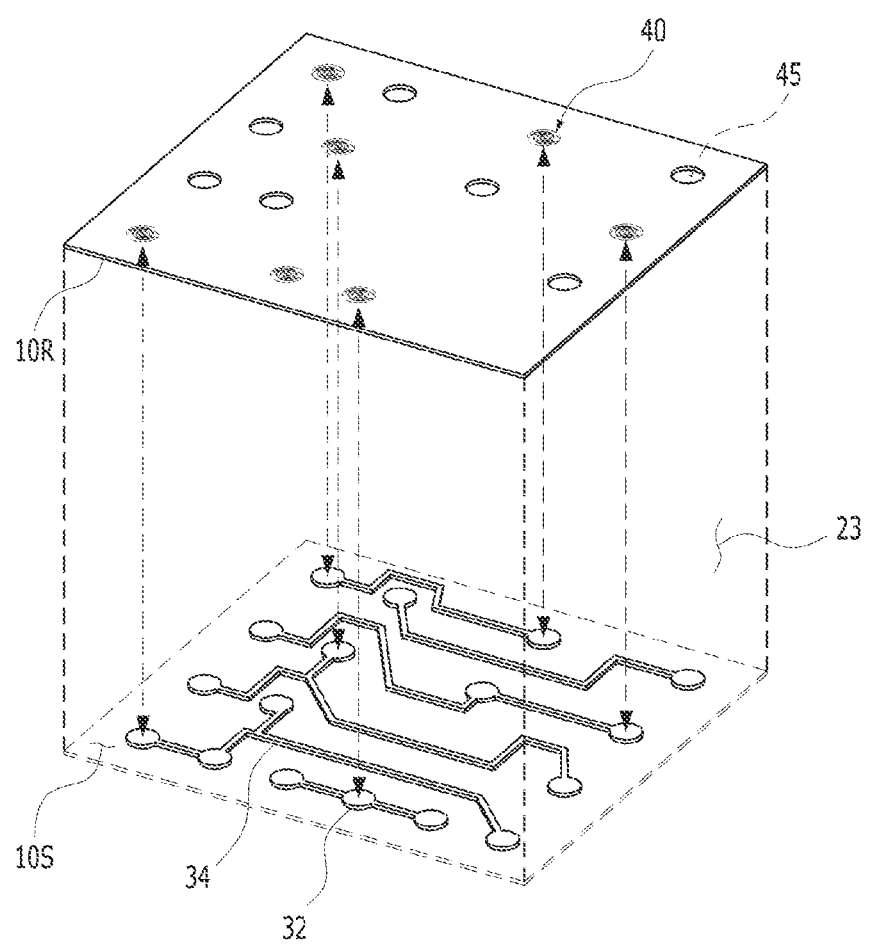
FIG. 2 is a view schematically illustrating two layers and of the conductive layers of the substrate according to an embodiment of the disclosure.
Figure 3A:
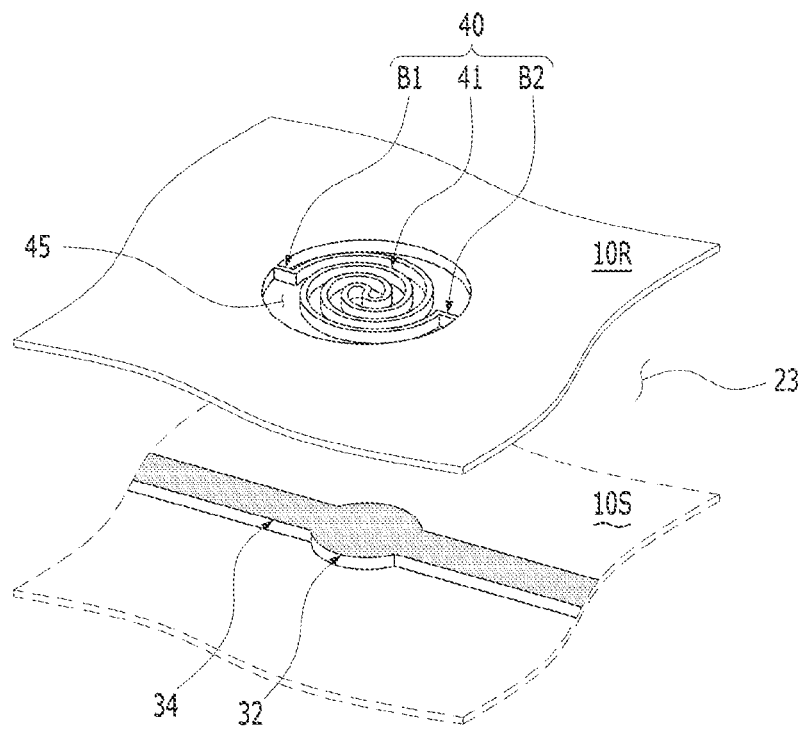
FIGS. 3A and 3B are enlarged views portions of FIG. 2.
Figure 3B:
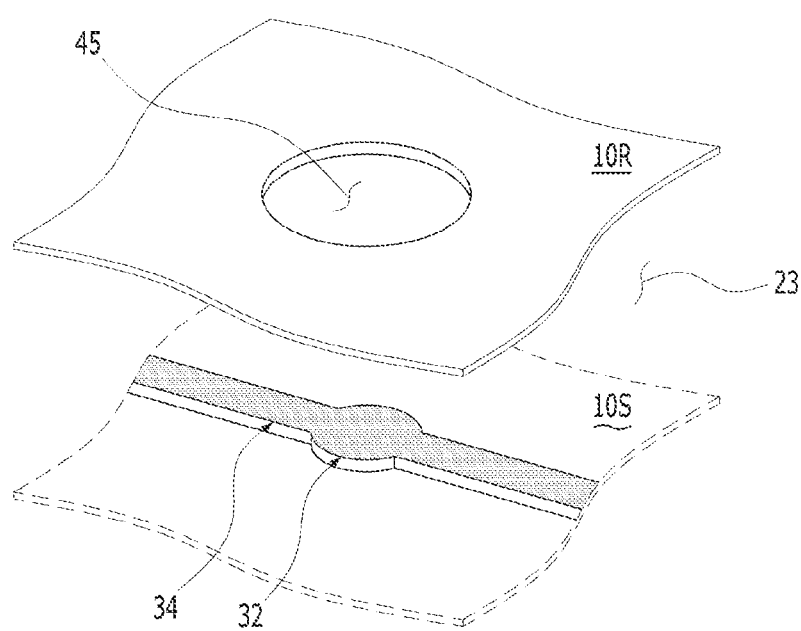

FIG. 2 is a view schematically illustrating two layers 10S and 10R of the conductive layers 10 of the substrate 100 according to an embodiment of the disclosure, and FIGS. 3A and 3B are enlarged views portions of FIG. 2. Referring to FIGS. 2, 3A, and 3B, the conductive layers 10 of the substrate 100 according to an embodiment of the disclosure may include a signal transmission layer 10S and a reference voltage layer 10R. The substrate 100 may further include a dielectric layer 23 between the signal transmission layer 10S and the reference voltage layer 10R.

The signal transmission layer 10S may include a plurality of signal transmission pads 32 and a plurality of signal transmission interconnections 34. Each of the signal transmission pads 32 may include a pad structure to be electrically connected to a vertical via plug or a solder ball. That is, each of the signal transmission interconnections 34 may have a line shape extending in a horizontal direction, and each of the signal transmission pads 32 may have a circular shape or a polygonal shape. Each of the signal transmission pads 32 may have a width wider than a width of each of the signal transmission interconnections 34. Each of the signal transmission interconnections 34 may selectively electrically connect two or more signal transmission pads 32 to each other.

The reference voltage layer 10R may be one of a power voltage layer, a ground voltage layer, or other voltage layers (e.g., a VDD layer, a VDDq layer, a VSS layer, a VCCq layer, a VPP layer, or etc.). In the embodiment, it is assumed and described that the reference voltage layer 10R is a ground voltage layer.

The reference voltage layer 10R may include at least one impedance calibrator 40. Referring to FIG. 3A, the impedance calibrator 40 may be disposed at a position vertically overlapping the signal transmission pad 32 of the signal transmission layer 10S. In another embodiment, the impedance calibrator 40 may be disposed at a position vertically overlapping the signal transmission interconnection 34 of the signal transmission layer 10S.

The impedance calibrator 40 may include an inductor calibration part 41 and lower and upper bridges B1 and B2.

In another embodiment, the impedance calibrator 40 may include at least one of the inductor calibration part 41 and the lower and upper bridges B1 and B2. Both the lower bridge B1 and the upper bridge B2 of the impedance calibrator 40 may be electrically connected to the reference voltage layer 10R. For example, the lower bridge B1 may electrically connect a first portion of the impedance calibration part 41 to a first portion of the reference voltage layer 10R. For example, the upper bridge B2 may electrically connect a second portion of the impedance calibration part 41 to a second portion of the reference voltage layer 10R.

The reference voltage layer 10R may further include a space hole 45. The space hole 45 may be an empty space and may vertically pass through the reference voltage layer 10R to spatially connect an upper area and a lower area of the reference voltage layer 10R. Referring to FIGS. 3A and 3B, the space hole 45 may vertically overlap the signal transmission pad 32 of the signal transmission layer 10S. Referring to FIG. 3A, the impedance calibration part 41 may be disposed in the space hole 45. The impedance calibration part 41 in the space hole 45 may be electrically connected to the reference voltage layer 10R through the lower and upper bridges B1 and B2.

Figure 4:
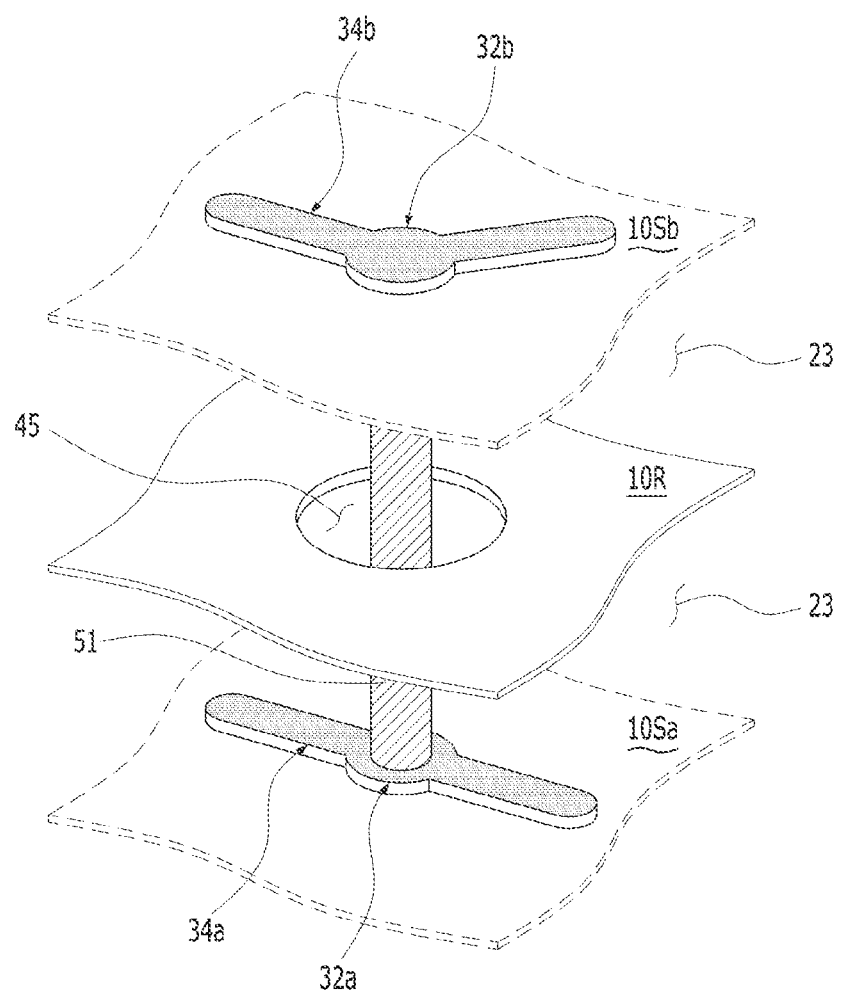
FIG. 4 is a perspective view schematically illustrating that the signal transmission via plug vertically extends through the space hole in the substrate according to an embodiment of the disclosure.

FIG. 4 is a perspective view schematically illustrating that the signal transmission via plug 51 vertically extends through the space hole 45 in the substrate 100 according to an embodiment of the disclosure. Referring to FIG. 4, the substrate 100 according to an embodiment of the disclosure may include a lower signal transmission layer 10Sa, an upper signal transmission layer 10Sb, a reference voltage layer 10R, and a signal transmission via plug 51. The lower signal transmission layer 10Sb may be positioned below the reference voltage layer 10R. The upper signal transmission layer 10Sb may be positioned over the reference voltage layer 10R. That is, the reference voltage layer 10R may be disposed between the lower signal transmission layer 10Sa and the upper signal transmission layer 10Sb. The dielectric layers 23 may be interposed between the lower signal transmission layer 10Sa and the reference voltage layer 10R, and between the reference voltage layer 10R and the upper signal transmission layer 10Sb.

The lower signal transmission layer 10Sa may include a lower signal transmission pad 32a and a lower signal transmission interconnection 34a, and the upper signal transmission layer 10Sb may include an upper signal transmission pad 32b and an upper signal transmission interconnection 34b. The signal transmission via plug 51 may vertically pass through the space hole 45 of the reference voltage layer 10R to electrically connect the lower signal transmission pad 32a of the lower signal transmission layer 10Sa to the upper signal transmission pad 32b of the upper signal transmission layer 10Sb.

FIGS. 5A to 5I are top views illustrating single layer impedance calibrators 40a to 40i according to various embodiments of the disclosure. Referring to FIGS. 5A to 5I, the reference voltage layers 10R in accordance with various embodiments of the disclosure may include at least one impedance calibrators 40a to 40i. The impedance calibrators 40a to 40i may include impedance calibration parts 41a to 41i and a plurality of bridges B1 to B4, respectively.

Figure 5A:
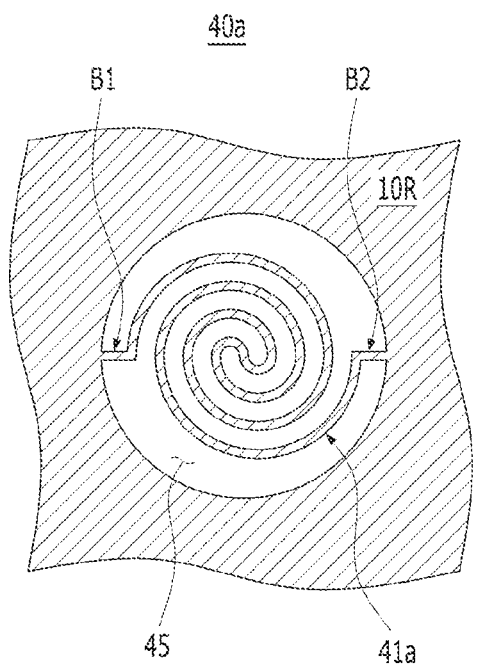
FIGS. 5A, 5B, 5C, 5D, 5E, 5F, 5G, 5H, and 5I are top views illustrating single layer impedance calibrators to according to various embodiments of the disclosure.
Figure 5B:
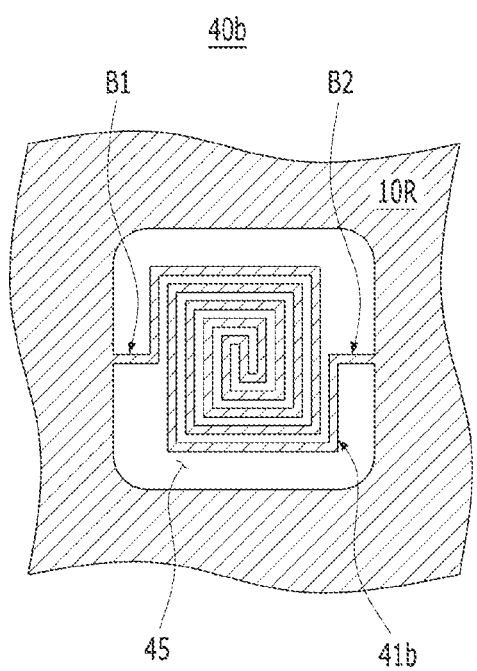
Figure 5C:
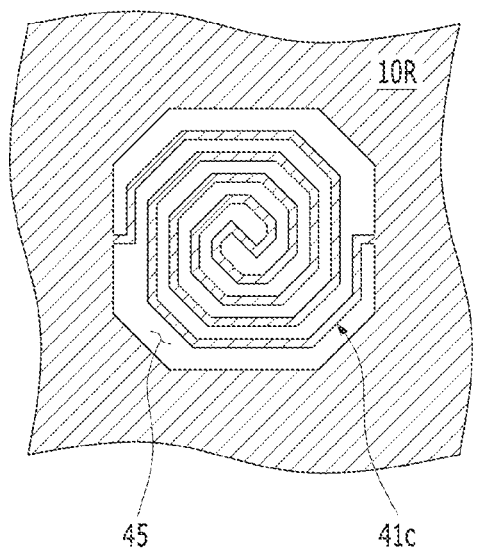

Referring to FIGS. 5A to 5C, the impedance calibrators 40a to 40c according to embodiments of the disclosure may include impedance calibration parts 41a to 41c having a spiral shape and the bridges B1 and B2, respectively. The bridges B1 and B2 may electrically connect a portion of an outer circumference of the impedance calibration parts 41a to 41c to the reference voltage layer 10R, respectively. The bridges B1 and B2 may be formed of the same metal as the impedance calibration parts 41a to 41c. Accordingly, the bridges B1 and B2 and the impedance calibration parts 41a to 41c may be materially continuous with each other. The bridges B1 and B2 may be disposed at positions opposite to each other. In another embodiment, the bridges B1 and B2 may be disposed along directions perpendicular to each other. In another embodiment, the bridges B1 and B2 may be disposed adjacent to each other in the same direction. In another embodiment, each of the impedance calibrators 40a to 40c may include only one of bridges B1 and B2.

Referring to FIG. 5A, the impedance calibration part 41a may have a circular spiral shape. Referring to FIG. 5B, the impedance calibration part 41b may have a rectangular spiral shape. Referring to FIG. 5C, the impedance calibration part 41c may have a polygonal spiral shape. For example, it is illustrated that the impedance calibration part 41c has an octagonal spiral shape.

Figure 5D:
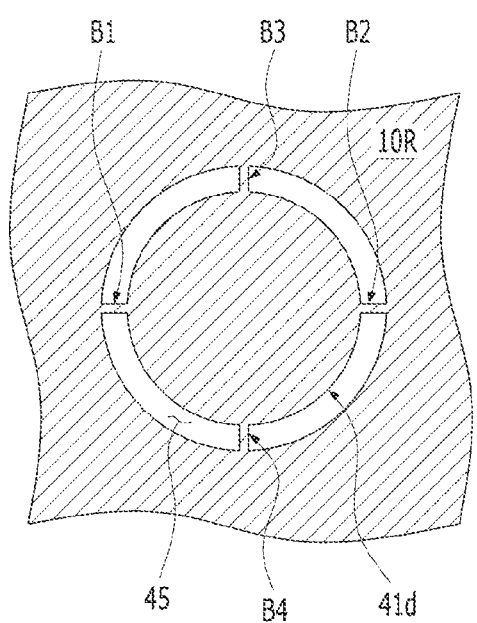
Figure 5E:
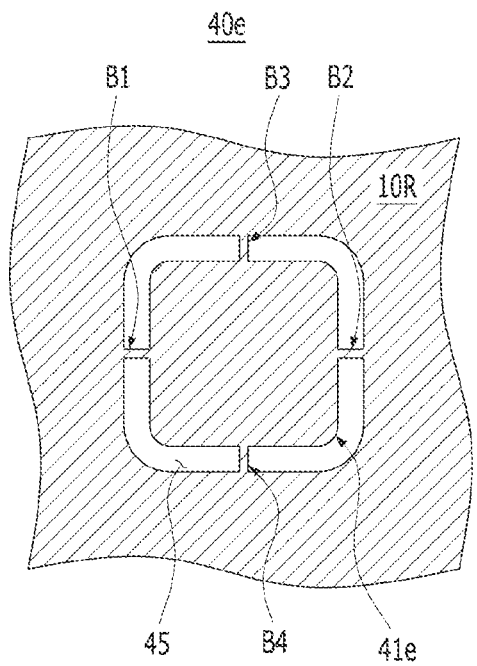
Figure 5F:
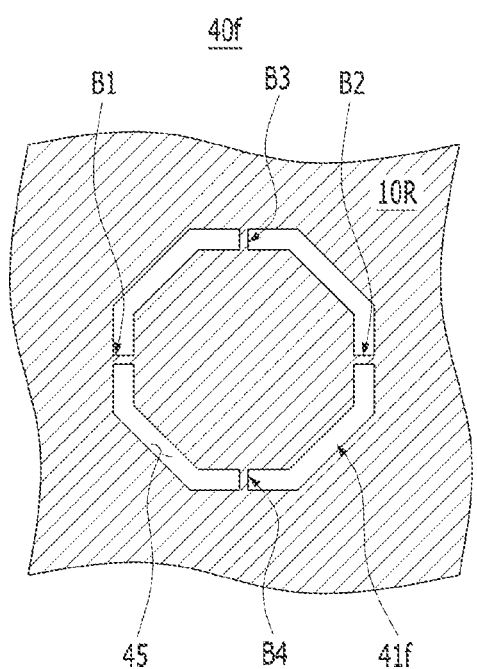

Referring to FIGS. 5D to 5F, the impedance calibration parts 41d to 41f according to embodiments of the disclosure may have plate shapes. The impedance calibration parts 41d to 41f may be electrically connected to the reference voltage layer 10R through the bridges B1 to B4. Referring to FIG. 5D, the impedance calibration part 41d may have a circular plate shape. Referring to FIG. 5E, the impedance calibration part 41e may have a rectangular plate shape. Referring to FIG. 5F, the impedance calibration part 41f may have a polygonal plate shape. For example, it is illustrated that the impedance calibration part 41f has an octagonal plate shape.

Figure 5G:
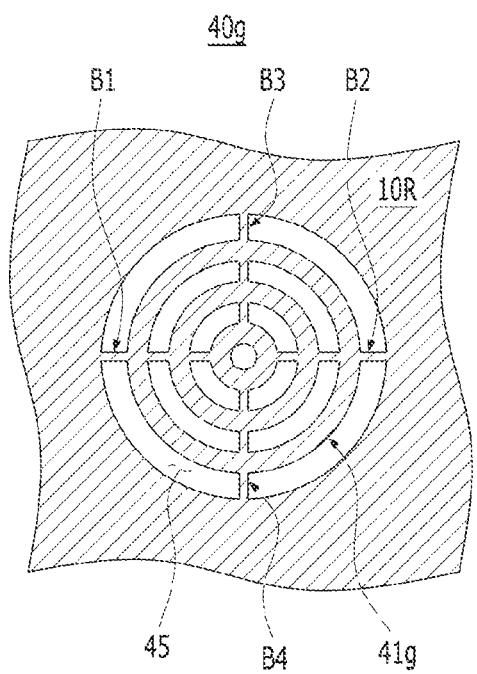
Figure 5H:
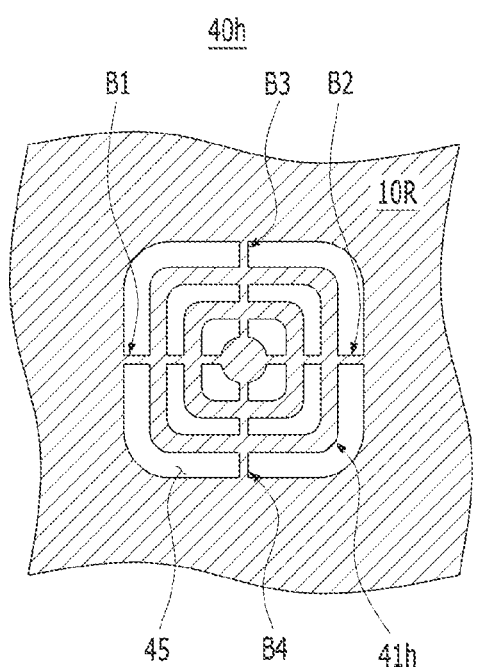
Figure 5I:
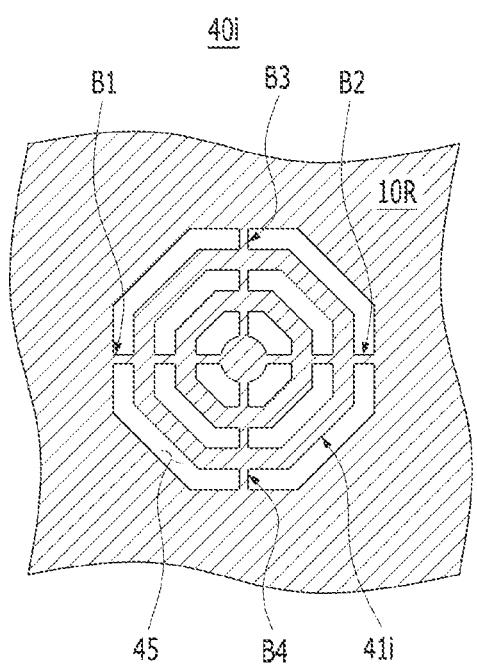

Referring to FIGS. 5G to 5I, the impedance calibration parts 41g to 41i in accordance with the embodiments of the disclosure may have concentric circles or web shapes. Referring to FIG. 5G, the impedance calibration part 41g may have a circular web shape, that is, a concentric circles shape. Referring to FIG. 5H, the impedance calibration part 41h may have a rectangular web shape. Referring to FIG. 5I, the impedance calibration part 41i may have a polygonal web shape. For example, it is illustrated that the impedance calibration part 41g has an octagonal web shape.

In other embodiments, the impedance calibrators 40a to 40h may have a plurality of bridges B1 to B4. The plurality of bridges B1 to B4 may be disposed in opposite and/or vertical directions. In still other embodiments, the impedance calibrators 40a to 40h may include a plurality of bridges B1 to B4. The plurality of bridges B1 to B4 may be disposed opposite, perpendicular, or in a diagonal direction.

The space hole 45 may have a circular or polygonal shape corresponding to the shapes of the impedance calibration parts 41a to 41i.

Figure 6A:
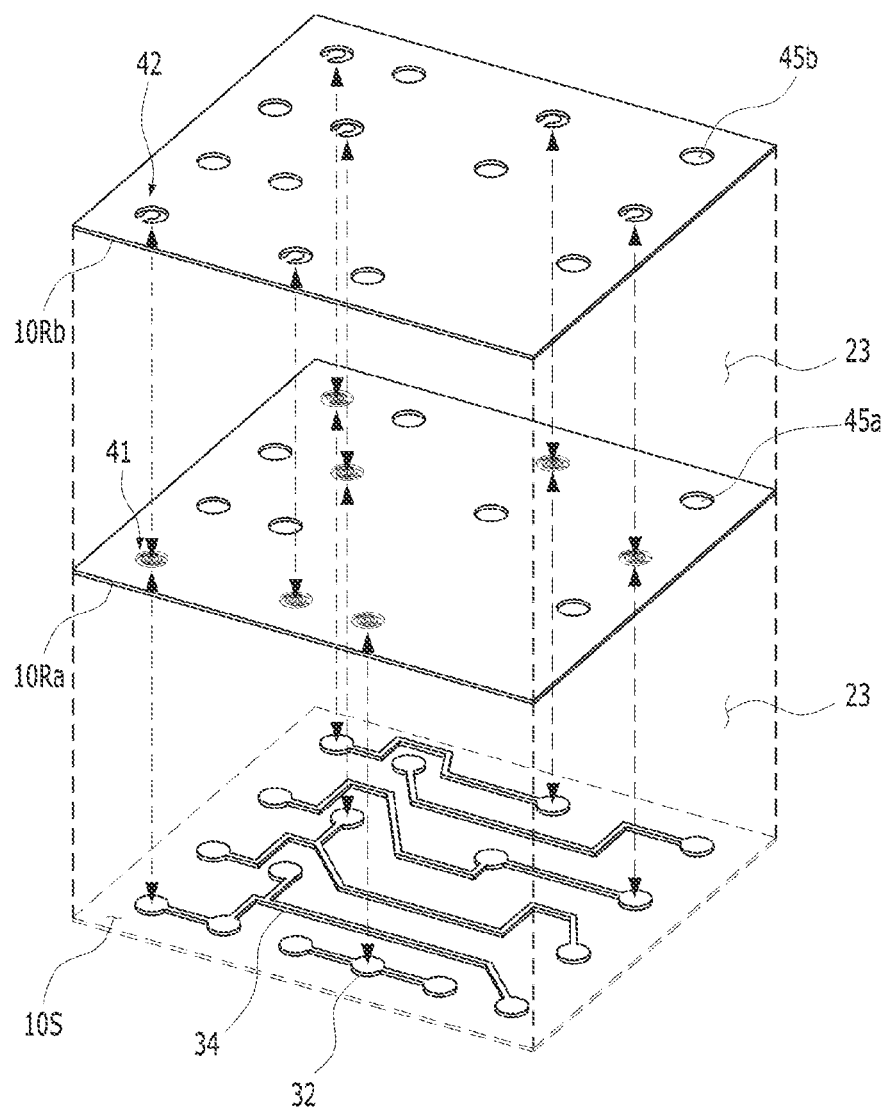
FIG. 6A is a view schematically showing three layers of the conductive layers of the substrate according to an embodiment of the disclosure.
Figure 6B:
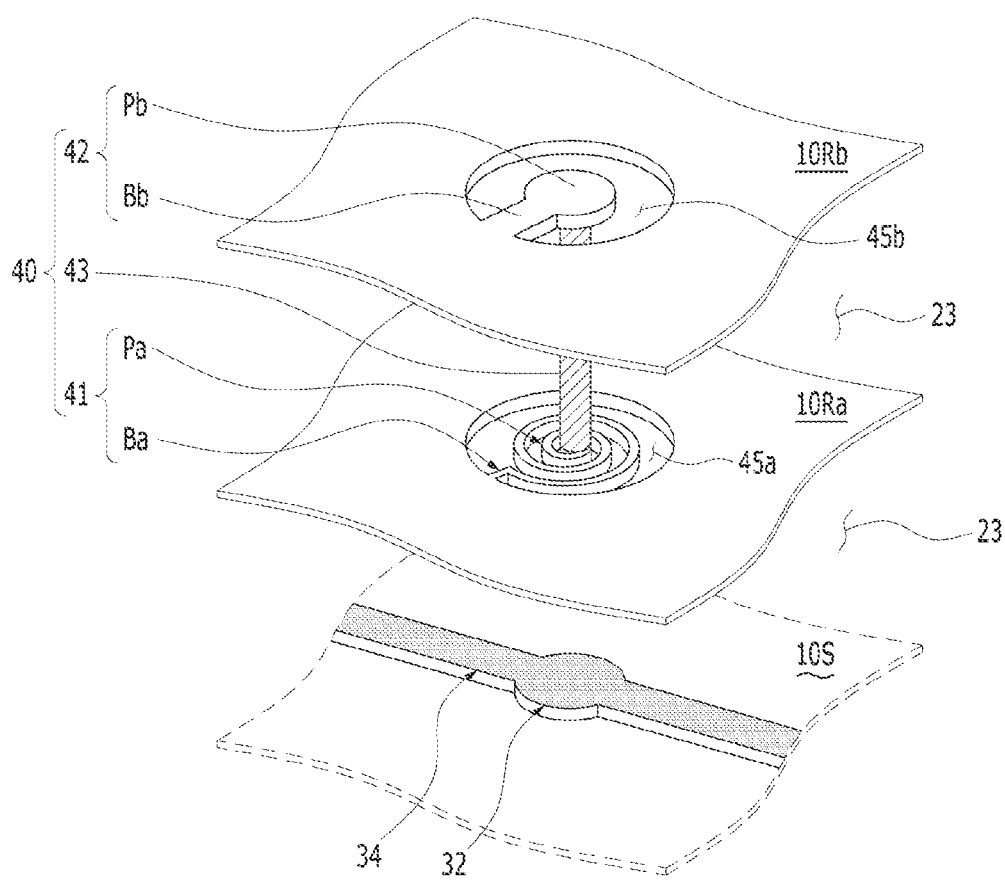
FIG. 6B is an enlarged view of a portion of FIG. 6A.

FIG. 6A is a view schematically showing three layers 10S, 10Ra, and 10Rb of the conductive layers 10 of the substrate 100 according to an embodiment of the disclosure, and FIG. 6B is an enlarged view of a portion of FIG. 6A. Referring to FIGS. 6A and 6B, the substrate 100 according to an embodiment of the disclosure may include a signal transmission layer 10S, a lower reference voltage layer 10Ra, an upper reference voltage layer 10Rb, dielectric layers 23, and an impedance calibrator 40. The signal transmission layer 10S and the lower reference voltage layer 10Ra may be stacked to be vertically adjacent to each other. The lower reference voltage layer 10Ra and the upper reference voltage layer 10Rb may be stacked to be vertically adjacent to each other. The signal transmission layer 10S may include a signal transmission pad 32 and a signal transmission interconnection 34.

The impedance calibrator 40 may include an impedance calibration part 41, an impedance calibration pad 42, and an impedance calibration via plug 43. The impedance calibrator 40 may further include lower and upper bridges Ba and Bb and lower and upper bridge pads Pa and Pb. The impedance calibration part 41, the lower bridge Ba, and the lower bridge pad Pa may be included and disposed in the lower reference voltage layer 10Ra. The impedance calibration pad 42, the upper bridge Bb, and the upper bridge pad Pb may be included and disposed in the upper reference voltage layer 10Rb.

The lower reference voltage layer 10Ra may include a lower space hole 45a in which the impedance calibration part 41 is disposed. For example, the impedance calibration part 41 may be disposed in the lower space hole 45a to be spaced apart from the lower reference voltage layer 10Ra. The upper reference voltage layer 10Rb may include an upper space hole 45b in which the upper bridge pad Pb is disposed. For example, the upper bridge pad Pb may be disposed in the upper space hole 45b to be spaced apart from the upper reference voltage layer 10Rb.

The lower bridge Ba may electrically connect a portion of the outer circumference of the impedance calibration part 41 to the lower reference voltage layer 10Ra. The lower bridge pad Pa may be located at a middle position of the impedance calibration part 41. In another embodiment, the lower bridge pad Pa may be located outside the impedance calibration part 41. In one embodiment, the lower reference voltage layer 10Ra, the lower bridge Ba, and the lower bridge pad Pa may be formed of the same metal.

The upper bridge pad Pb may be disposed in a middle portion of the upper space hole 45b to be vertically aligned with the lower bridge pad Pa. In another embodiment, the upper bridge pad P2 may be disposed outside the upper space hole 45b to be vertically aligned with the upper bridge pad P2. The upper bridge Bb may electrically connect the upper bridge pad Pb to the upper reference voltage layer 10Rb. In one embodiment, the upper reference voltage layer 10Rb, the upper bridge Bb, and the upper bridge pad Pb may be formed of the same metal to be materially continuous with each other.

The impedance calibration via plug 43 may vertically pass through the dielectric layer 23 to electrically connect the impedance calibration part 41 to the impedance calibration pad 42. Specifically, the impedance calibration via plug 43 may vertically pass through the dielectric layer 23 to electrically connect a lower bridge pad Pa of the impedance calibration part 41 to an upper bridge pad Pb of the impedance calibration pad 42. For example, the lower bridge Pa of the impedance calibration part 41 of the lower reference voltage layer 10Ra may be electrically connected to a lower end of the impedance calibration via plug 43. The upper bridge pad Pb of the impedance calibration pad 42 of the upper reference voltage layer 10Rb may be electrically connected to the upper end of the impedance calibration via plug 43.

The lower reference voltage layer 10Ra and the upper reference voltage layer 10Rb may have the same voltage level. For example, the lower reference voltage layer 10Ra and the upper reference voltage layer 10Rb may be ground layers. In other embodiments, the lower reference voltage layer 10Ra and the upper reference voltage layer 10Rb may be power layers having the same voltage level. In other embodiments, the lower reference voltage layer 10Ra may be one of the power layer and the ground layer, and the upper reference voltage layer 10Rb may be other one of the power layer and the ground layer.

The signal transmission pad 32 of the signal transmission layer 10S and the impedance calibration part 41 of the impedance calibrator 40 may be disposed adjacent to each other to vertically overlap each other. In another embodiment, the signal transmission interconnection 34 of the signal transmission layer 10S and the impedance calibration part 41 of the impedance calibrator 40 may be disposed adjacent to each other to vertically overlap each other. Accordingly, the impedance calibration part 41 of the lower reference voltage layer 10Ra may be coupled to an electrical signal on the signal transmission pad 32 and the signal transmission interconnection 34 of the signal transmission layer 10S. For example, a coupling phenomenon occurs between the impedance calibration part 41 and the signal transmission pad 32, which can remove noise on the signal transmission pad 32 and stabilize the electrical signal.

Although it is illustrated that the impedance calibration part 41 has a spiral shape in the embodiment, the impedance calibration part 41 may have various shapes shown in FIGS. 5A to 5I in various embodiments. Accordingly, the lower bridge pad Pa may be disposed at various positions other than the middle portion of the impedance calibration part 41. In addition, in FIGS. 6A and 6B, the hatchings of elements are omitted to facilitate understanding of the technical idea of the disclosure.

Figure 7A:
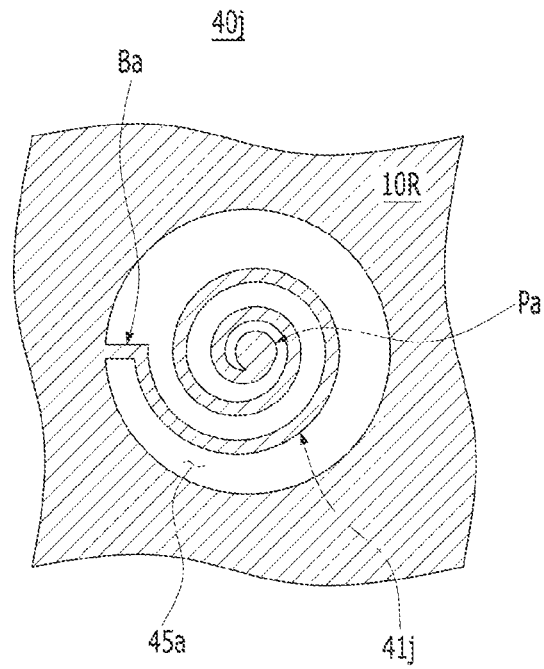
FIGS. 7A, 7B, and 7C are top views illustrating impedance calibration parts to of impedance calibrators to of the lower reference voltage layer of the substrate according to various embodiments of the disclosure.
Figure 7B:
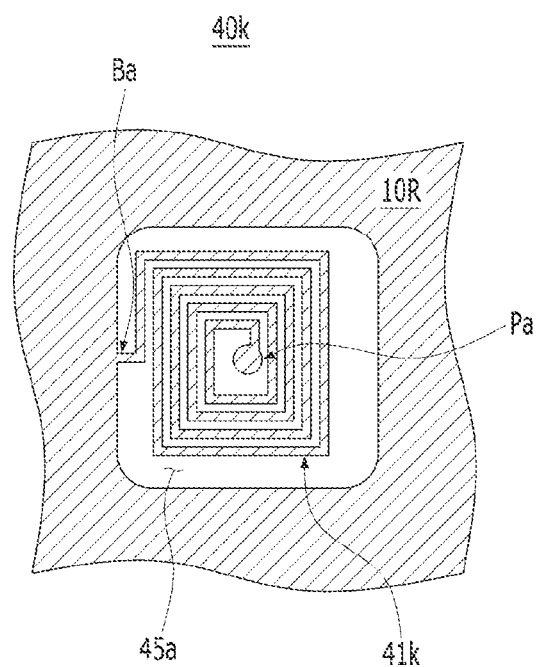
Figure 7C:
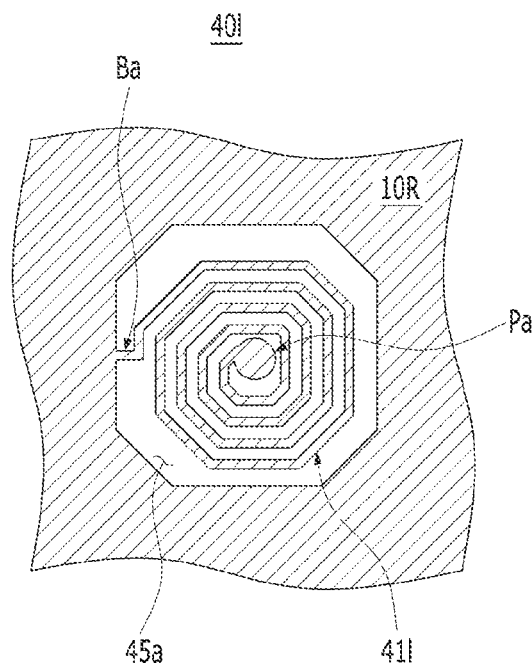

FIGS. 7A to 7C are top views illustrating impedance calibration parts 41j to 41l of impedance calibrators 40j to 40l of the lower reference voltage layer 10Ra of the substrate 100 according to various embodiments of the disclosure. Referring to FIGS. 7A to 7C, the impedance calibration parts 41j to 41l of the impedance calibrators 40j to 40l according to various embodiments of the disclosure may have a single spiral shape. The lower bridge Ba of the impedance calibrators 40j to 40l may electrically connect the lower reference voltage layer 10Ra to the impedance calibration parts 41j to 41l, respectively. The lower bridges Ba of the impedance calibrators 40j to 40l may be disposed at a middle portion of the spiral shape of the impedance calibration parts 41j to 41l. In other embodiments, referring to FIGS. 5D to 5I, the impedance calibration parts 41j to 41l may have a plate shape or a web shape.

Figure 8:
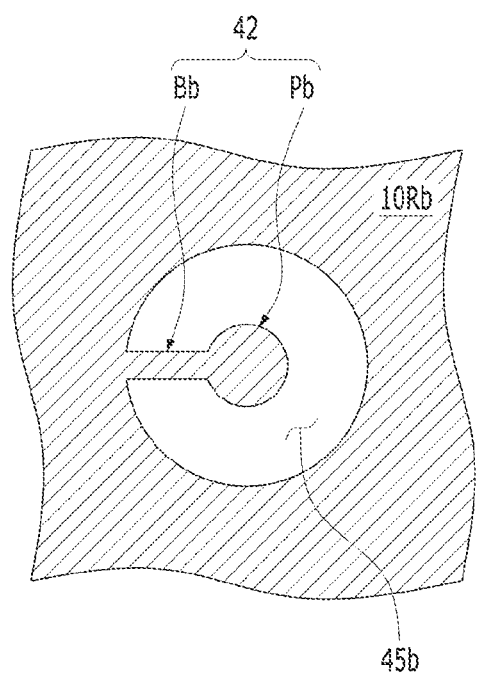
FIG. 8 is a top view schematically illustrating the impedance calibrator bridge pad in the upper reference voltage layer of the substrate according to an embodiment of the disclosure.

FIG. 8 is a top view schematically illustrating the impedance calibration pad 42 in the upper reference voltage layer 10Rb of the substrate 100 according to an embodiment of the disclosure. Referring to FIG. 8, the impedance calibration pad 42 in the upper reference voltage layer 10Rb of the substrate 100 according to an embodiment of the disclosure may include an upper bridge Bb and an upper bridge pad Pb. The upper bridge Bb may electrically connect the upper reference voltage layer 10Rb to the upper bridge pad Pb. The upper bridge pad Pb may be electrically connected to the impedance calibration via plug 43. In another embodiment, the impedance calibration pad 42 may be omitted. For example, the space hole 45b surrounding the upper bridge pad Pb may be omitted. That is, the impedance calibration via plug 43 may be directly connected to the upper reference voltage layer 10Rb.

According to the embodiments of the disclosure, the impedance calibrator may be formed in the reference voltage layer. Accordingly, in an embodiment, the pattern density of the signal transmission layer can be reduced, and routings of signal transmission interconnections in the substrate can be also facilitated. According to the embodiments of the disclosure, the impedance calibrator may be vertically overlapped with the signal transmission pad. Accordingly, in an embodiment, a coupling effect with signals on the signal transmission pad and signal transmission interconnection can be generated. In an embodiment, the coupling effect can be appropriately controlled by a size, a shape, and a position of the impedance calibrator.

While the present disclosure has been described with respect to specific embodiments, it should be noted that the embodiments are for describing, not limiting, the present disclosure. Further, it should be noted that the present disclosure may be achieved in various ways through substitution, change, and modification, by those skilled in the art without departing from the scope of the present disclosure as defined by the following claims.

What is claimed is:

1. A substrate comprising:
   a signal transmission layer including a signal transmission pad and a signal transmission interconnection;
   a first dielectric layer stacked over the signal transmission layer; and
   a first reference voltage layer stacked over the first dielectric layer,
   wherein the first reference voltage layer includes
   an impedance calibration part; and
   a first bridge electrically connecting a first portion of the impedance calibration part to a first portion of the first reference voltage layer,
   wherein the impedance calibration part has one of a spiral shape and a web shape,
   wherein the impedance calibration part has a first bridge pad at a central portion of the impedance calibration part, and
   wherein the first bridge pad of the impedance calibration part and a central portion of the signal transmission pad are vertically aligned with each other.

2. The substrate of claim 1,
   wherein the first reference voltage layer further includes a second bridge electrically connecting a second portion of the impedance calibration part to a second portion of the first reference voltage layer.

3. The substrate of claim 1,
   wherein the reference voltage layer is one of a ground layer and a power layer.

4. The substrate of claim 1,
   wherein:
   the first reference voltage layer is a copper foil layer, and the first dielectric layer is a prepreg layer.

5. The substrate of claim 1,
   wherein the first reference voltage layer, the impedance calibration part, and the first bridge include a same metal.

6. The substrate of claim 1, further comprising:
   a second reference voltage layer stacked over the first reference voltage layer and including a second bridge pad,
   the first bridge pad and the second bridge pad are vertically aligned with each other.

7. The substrate of claim 6, further comprising:
   an impedance calibration via plug vertically and electrically connecting the first bridge pad to the second bridge pad.

8. The substrate of claim 1, wherein the impedance calibration part includes an inductor.

9. The substrate of claim 1, wherein the impedance calibration part and the signal transmission pad vertically and completely overlap with each other.

10. A substrate comprising:
    a first signal transmission layer;
    a first reference voltage layer stacked over the first signal transmission layer; and wherein the first signal transmission layer includes a first signal transmission pad and a first signal transmission interconnection, wherein the first reference voltage layer includes:

a first space hole vertically aligned with the first signal transmission pad;

an impedance calibration part disposed in the first space hole to be vertically aligned with the first signal transmission pad; and a first bridge electrically connecting a first portion of the impedance calibration part to a first portion of the first reference voltage layer, wherein the impedance calibration part has one of a spiral shape and a web shape, and wherein a central portion of the signal transmission pad and a central portion of the impedance calibration part are vertically aligned with each other.

11. The substrate of claim 10, wherein the first reference voltage layer further includes a second bridge electrically connecting a second portion of the impedance calibration part to a second portion of the first reference voltage layer.

12. The substrate of claim 10, further comprising:

a second reference voltage layer stacked over the first reference voltage layer, wherein the second reference voltage layer includes:

a second space hole vertically aligned with the first space hole; and an impedance calibration pad disposed in a central portion of the second space hole, wherein the central portion of the second space hole, the central portion of the impedance calibration part, and a central portion of the impedance calibration pad are vertically aligned with each other.

13. The substrate of claim 12, further comprising:

an impedance calibration via plug vertically and electrically connecting the central portion of the impedance calibration part to the central portion of the impedance calibration pad.

14. The substrate of claim 12, wherein a first voltage level of the first reference voltage layer and a second voltage level of the second reference voltage layer are the same.

15. The substrate of claim 10, further comprising:

a second signal transmission layer stacked over the first reference voltage layer, wherein the second signal transmission layer includes a second signal transmission pad and a second signal transmission interconnection, wherein the central portion of the first signal transmission pad, and the second signal transmission pad are vertically aligned with each other.

16. The substrate of claim 15, further comprising:

a signal transmission via plug vertically passing through the first space hole to vertically and electrically connect the first signal transmission pad to the second signal transmission pad.

17. The substrate of claim 10, wherein the impedance calibration part includes an inductor.

18. The substrate of claim 10, wherein the signal transmission pad and the impedance calibration part vertically and completely overlap with each other.

* * * * *